(12) United States Patent
Baker

(10) Patent No.: US 8,172,126 B2
(45) Date of Patent: May 8, 2012

(54) JOINING OF PARTS VIA MAGNETIC HEATING OF METAL-ALUMINUM POWDERS

(75) Inventor: Ian Baker, Etna, NH (US)

(73) Assignee: The Trustees of Dartmouth College, Hanover, NH (US)

(*) Notice: Subject to any disclaimer, the term of this patent is extended or adjusted under 35 U.S.C. 154(b) by 15 days.

(21) Appl. No.: 12/993,779

(22) PCT Filed: May 19, 2009

(86) PCT No.: PCT/US2009/044547
§ 371 (c)(1),
(2), (4) Date: Nov. 19, 2010

(87) PCT Pub. No.: WO2009/143173
PCT Pub. Date: Nov. 26, 2009

(65) Prior Publication Data
US 2011/0079631 A1    Apr. 7, 2011

Related U.S. Application Data

(60) Provisional application No. 61/054,380, filed on May 19, 2008.

(51) Int. Cl.
*B23K 31/02* (2006.01)
(52) U.S. Cl. .......... 228/233.1; 228/102; 228/245; 228/248.1; 228/214; 228/225
(58) Field of Classification Search .......... 228/102, 228/245, 248.1, 214, 225, 233.1
See application file for complete search history.

(56) References Cited

U.S. PATENT DOCUMENTS
3,953,056 A * 4/1976 Roberts .................. 281/29

FOREIGN PATENT DOCUMENTS
| JP | 04037658 A | 2/1992 |
| JP | 06047181 B2 | 5/1994 |
| JP | 2000271605 A | 10/2000 |
| JP | 2000315570 A | 11/2000 |

OTHER PUBLICATIONS

International Search Report and Written Opinion issued in related PCT Patent Application Serial No. PCT/US2009/044547, dated Jan. 19, 2010, 10 pages.

* cited by examiner

*Primary Examiner* — Jessica L Ward
*Assistant Examiner* — Erin Saad
(74) *Attorney, Agent, or Firm* — Lathrop & Goge LLP

(57) ABSTRACT

A method of joining at least two parts includes steps of dispersing a joining material comprising a multi-phase nanocrystalline magnetic metal-aluminum powder at an interface between the at least two parts to be joined and applying an alternating magnetic field (AMF). The AMF has a magnetic field strength and frequency suitable for inducing magnetic hysteresis losses in the metal-aluminum powder and is applied for a period that raises temperature of the metal-aluminum powder to an exothermic transformation temperature. At the exothermic transformation temperature, the metal-aluminum powder melts and resolidifies as a metal aluminide solid having a non-magnetic configuration.

20 Claims, 2 Drawing Sheets

JOINING OF PARTS VIA MAGNETIC HEATING OF METAL-ALUMINUM POWDERS

RELATED APPLICATIONS

This application claims the benefit of priority of U.S. Patent Application Ser. No. 61/054,380, filed May 19, 2008, which is incorporated by reference herein.

GOVERNMENT INTERESTS

The United States Government has rights in this invention under Contract No. 60NANB2D0120 between the National Institute of Science (NIST) and Dartmouth College.

BACKGROUND

1. Field of the Invention

This invention relates to methods of using an alternating magnetic field (AMF) to generate hysteresis losses in multiphase nanocrystalline metal-aluminum powders. When the powders are subjected to an AMF of appropriate strength and frequency for a suitable period, an exothermic reaction is triggered, which causes the powders to melt. A metal aluminide, having an ordered crystal structure, solidifies from the melt. The metal aluminide does not exhibit hysteretic behavior and cannot be melted by application of an AMF.

2. Description of the Related Art

The most common techniques for joining parts are soldering, brazing, and welding, which involve heating and liquifying metals or metal alloys at a seam or junction where two or more parts are to be joined. Heat is typically applied by a resistively heated solder gun or an acetylene torch. However, such 'brute force' heating methods often cause heating, not only of the solder or braze, but also of the parts to be joined, which may lead to dimensional distortion and changes in physical and/or mechanical properties.

In an attempt to provide more precise heating, methods of using AMFs to induce a flow of current and/or generate magnetic hysteresis losses within a joining material have been developed. However, each of these mechanisms has practical limitations when applied to conventional joining materials. For example, induction heating requires that a joining material be conductive and arranged to provide a conduction path. For this reason, it is generally not possible to inductively heat powders, which may be physically separated and/or coated with a surface oxide that prevents current flow between particles.

On the other hand, when heating via magnetic hysteresis losses the maximum achievable temperature is the Curie temperature of the magnetic material. Typically, the maximum achievable temperature (Curie temperature) is sufficient to melt polymeric materials, but not metals. Further, bonds formed between parts may be weakened by exposure to extraneous magnetic fields that can cause unintended reheating of the joining material.

Metal oxide particles dispersed within a polymer matrix represent one example of a known system that provides joining of parts via magnetic hysteresis losses. However, metal oxide systems suffer from the disadvantages discussed above, namely: (1) the Curie temperature of the metal oxide represents a maximum achievable temperature; (2) the matrix (polymer) material must have a melting point that is less than or equal to the Curie temperature of the metal oxide, which is typically between about 100 to 600° C.; (3) the metal oxide particles remain ferromagnetic within the resolidified polymer allowing the polymer to reheat and melt if subjected to another AMF; and (4) polymer bonds are typically weaker than metal or alloy bonds.

Another approach to obtaining precise heating involves the use of Ni—Al multilayer foils, which are deposited by thin film deposition techniques, between parts to be joined. The Ni—Al foils are ignited by a flame or electrical impulse. Following ignition, a nickel aluminide (NiAl) compound having an ordered B2 structure solidifies and bonds the parts together. This process provides precise heating and rapid bond formation. However, it is expensive to perform thin film deposition, and the use of thin film deposition generally limits the parts to be joined to those having planar surfaces.

SUMMARY

In an embodiment, a method of joining at least two parts includes steps of dispersing a joining material comprising a nanocrystalline metal-aluminum powder at an interface between the at least two parts to be joined and applying an alternating magnetic field (AMF). The AMF has a magnetic field strength and frequency suitable for inducing magnetic hysteresis losses in the metal-aluminum powder and is applied for a period that raises temperature of the metal-aluminum powder to an exothermic transformation temperature. At the exothermic transformation temperature, the metal-aluminum powder melts and resolidifies as a metal aluminide solid having a non-magnetic configuration.

DETAILED DESCRIPTION

Figure 1A:
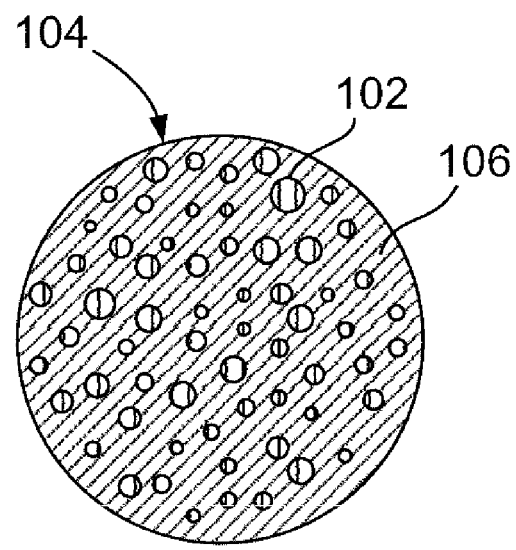
FIGS. 1A and 1B illustrate cross-sectional views of two exemplary metal-aluminum particles, according to an embodiment.

"Nanocrystalline" materials contain regions of crystallinity having nanometer scale dimensions, e.g., 100 nanometers or less. In one aspect, the nanocrystalline material may contain non-crystalline (amorphous) regions in addition to one or more crystal domains. In another aspect, the nanocrystalline material may be a completely crystalline material comprising a plurality of crystal domains.

The term "intermetallic compound" refers to a compound containing at least two different metals.

As used herein, the formula M-Al refers to metal-aluminum particles containing a metal, M, and aluminum, Al, where the particles contain a nanocrystalline arrangment of atoms. When the formula is written as (x)M-(y)Al, (x) and (y) represent concentrations of metal and aluminum in terms of atomic percent, respectively. The formula MAl refers to a metal aluminide having a metal, M, and aluminum, Al, arranged in a substantially ordered crystal structure.

"Induction heating" refers to heating of an electrically conductive material by eddy currents induced by a varying electromagnetic field. As discussed above, powders are generally not suitable for induction heating.

"Magnetic hysteresis loss" refers to energy lost as heat when the magnetization of a material is reversed in response to a varying electromagnetic field.

As used herein, a "non-magnetic" material does not exhibit significant hysteretic behavior in the presence of an alternating magnetic field, significant hysteretic behavior being characterized by a coercivity of 12.5 Oe or more. For example, diamagnetic materials, paramagnetic materials and antiferromagnetic materials are examples of "non-magnetic" materials, according to the present disclosure.

A "non-magnetic structure" or "non-magnetic configuration" is an arrangement of atoms, and paired electrons, that prevents significant hysteretic behavior.

On the other hand, a "magnetic" material exhibits significant hysteretic behavior in the presence of an alternating magnetic field, significant hysteretic behavior being characterized by a coercivity of 12.5 Oe or more. For example, ferromagnetic materials and ferrimagnetic materials are examples of "magnetic" materials, according to the present disclosure.

It has recently been demonstrated that when elemental powders of Fe and Al (40 at. %) of size 5-10 µm are milled for a short period (1-2 h) they produce particles having a nanocrystalline microstructure. The disordered atoms within the particles lead to ferromagnetic behavior and susceptibility to heating in an AMF. At 400° C., the particles undergo a phase transformation with a substantial heat output of about 175-200 J/g. (Q. Zeng and I. Baker, "Magnetic Properties and Thermal Ordering of Mechanically Alloyed Fe-40 at. % Al", *Intermetallics*, 14 (2006) 396-405.)

Without being bound by theory, it is believed that this heat output may arise from the reaction of nanocrystalline regions of Fe and Al, present in the milled powders, forming an ordered FeAl intermetallic compound. In particular, the heat of transformation from the reaction between Fe and Al to form B2-structured FeAl is 694 J/g (30.8 kJ/mol) for Fe-40 at. % Al and 874 J/g (36.3 kJ/mol) for Fe-50 at. % Al. (J. Breuer, A. Grün, F. Sommer and E. J. Mittemeijer, Metallurgical and Materials Transactions B, 32B, 913.)

Figure 1B:
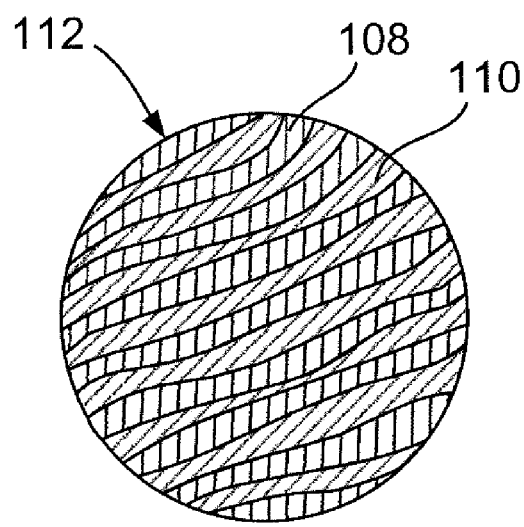

FIGS. 1A and 1B illustrate cross-sectional views of two exemplary metal-aluminum particles. In FIG. 1A, a first metal 102, e.g., Al, is randomly distributed throughout a particle 104 that is predominantly composed of a second metal 106, e.g., Fe. It will be appreciated that first and second metals 102, 106 may be interchanged and that more than two metals may be present in a single particle 104. In FIG. 1B, a first metal 108 and a second metal 110 are shown as forming layers within a particle 112. Again, more than two metals 108, 110 may be present in a single particle 112 having a layered configuration. Other configurations, which are not illustrated, are also possible.

When the elemental powders of Fe and Al (40 at. %) of size 5-10 µm are milled for longer times (>10 h), disordered b.c.c. Fe-Al is formed, which produces a small heat output at ~180-200° C. of ~20 J/g due to an ordering reaction that forms B2-structured FeAl.

Methods of utilizing nanocrystalline magnetic metal-aluminum powders, of the type described above, and the associated heat output from one or more exothermic transformations, to join parts are disclosed herein. Nanocrystalline magnetic metal-aluminum powders may be produced, for example, by the mechanical alloying/milling technique described by Zeng and Baker, or by other known techniques, such as inert gas condensation, severe plastic deformation, plasma processing, and laser ablation. Generally, nanocrystalline particles useful in the present methods will have diameters between 1 µm and 25 µm or between 5 µm and 10 µm.

Figure 2:
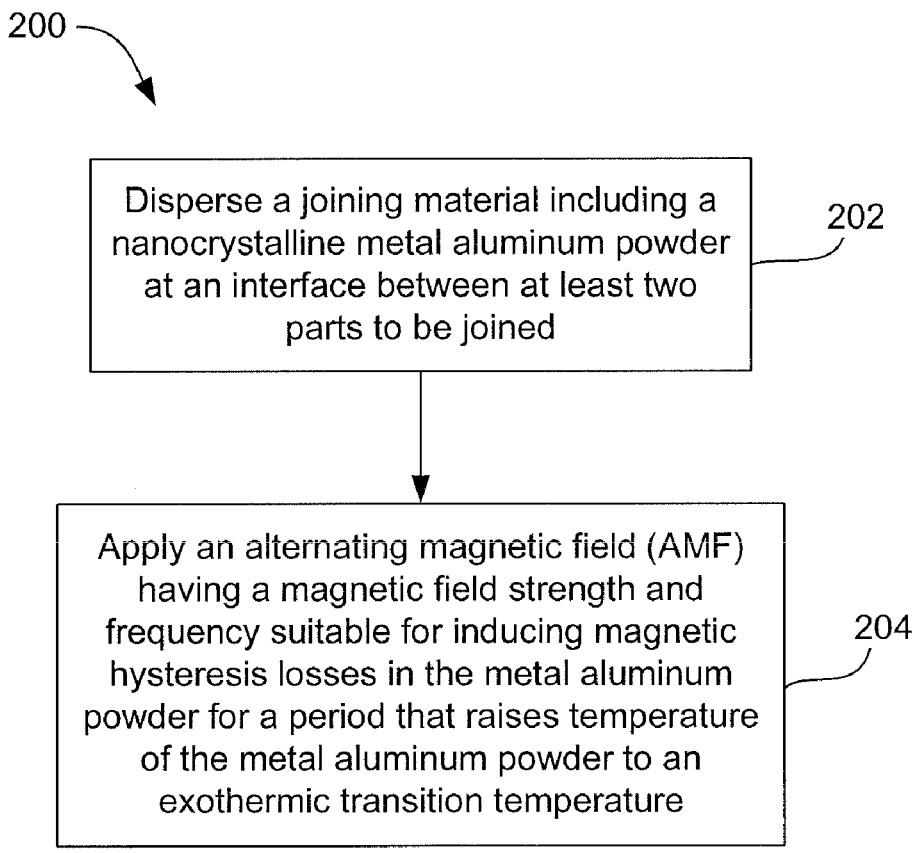
FIG. 2 is a flowchart illustrating steps for an exemplary method of joining at least two parts, according to an embodiment.
Figure 3:
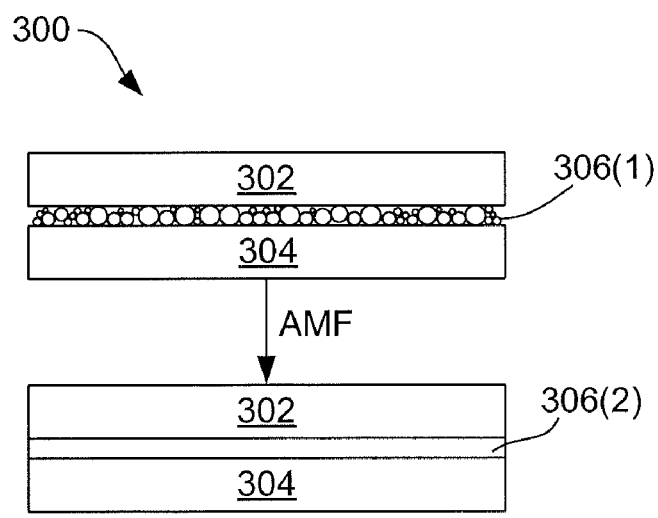
FIG. 3 depicts two parts being joined in accordance with the method of FIG. 2.

In one example of a method for joining two or more parts, illustrated in flowchart 200 of FIG. 2 and schematic 300 of FIG. 3, nanocrystalline metal-aluminum powder 306(1) is dispersed at an interface between two or more parts 302, 304 to be joined. See step 202. An AMF having a magnetic field strength and frequency suitable for inducing magnetic hysteresis losses in metal-aluminum powder 306(1) is applied, in step 204, for a period that raises the temperature of metal-aluminum powder 306(1) to an exothermic transformation temperature. For example, an AMF of 210 Oe having a frequency of 250 KHz produces a heating rate of 15° C./s for nanocrystalline Fe-40Al. Metal-aluminum powder 306(1) reaches 400° C. in about 25s and undergoes an exothermic transformation that causes melting of the powder. Upon resolidification, a solid metal aluminide 306(2) having an ordered B2 structure is formed. Metal aluminides having the B2 structure are non-magnetic, so further heating by an AMF does not occur to a significant amount.

Generally, AMFs suitable for use in the present methods will have magnetic field strengths between 50 Oe and 2000 Oe, or between 100 Oe and 1000 Oe, or between 150 Oe and 500 Oe, or between 200 Oe and 300 Oe, as well as frequencies between 25 KHz and 100 MHz, or between 50 KHz and 1 MHz, or between 100 KHz and 500 KHz. The AMF is typically applied to the joining material for a period between 5 seconds and 100 seconds, or between 10 seconds and 60 seconds, or between 15 seconds and 35 seconds, or between 20 seconds and 30 seconds.

The disclosed methods may involve various types of nanocrystalline metal-aluminum powders, in which one or more of the metals, M, is magnetic, e.g. iron, nickel or cobalt. For example, the nanocrystalline metal-aluminum may include one or more metals, M, for the formation of a metal aluminide selected from the group consisting of iron aluminide, nickel aluminide, cobalt aluminide, ternary intermetallic compounds comprising Al and two metals selected from Fe, Ni and Co, quaternary intermetallic compounds comprising Fe, Ni, Co and Al, and physical mixtures thereof In one example, Breuer et al. showed that a large heat output may be gained if Ni is partially substituted for Fe or Al in Fe-40Al.

Magnetic metal-aluminum powders, where M represents one or more metals, containing between 55 and 80 atomic percent M and between 20 and 45 atomic percent Al; or between 55 and 65 atomic percent M and between 35 and 45 atomic percent Al; or between 57 and 63 atomic percent M and between 37 and 43 atomic percent Al, may be used in the present methods.

The exothermic transformation temperature of the metal-aluminum powder may be controlled by varying the chemical composition of the powder and/or by creating physical mixtures of metal-aluminum powders. For example, Fe-40Al may be doped with Ni, as disclosed by Breuer et al., to affect a chemical change that yields a ternary intermetallic compound, whereas Fe-40Al may be mixed with Ni-40Al to create a physical mixture of two binary intermetallic compounds.

Various parts may be joined by the methods disclosed herein. For example, a ceramic, a metal, a semiconductor, or a polymer may be joined with one or more parts selected from ceramics, metals, semiconductors and polymers, e.g., polymer-polymer, semiconductor-semiconductor, ceramic-ceramic, polymer-metal, polymer-semiconductor, polymer-ceramic, metal-semiconductor, metal-ceramic and semiconductor-ceramic combinations are possible.

When joining a metal part to a non-metallic part, the AMF must be applied from the non-metallic side since the metal will both be heated by eddy current heating and block the AMF from reaching the interface. In applying an AMF from the non-metallic side, a higher frequency is better since the skin penetration depth of an AMF decreases as the negative square root of the frequency. At 1 MHz, the skin penetration depth is about 66 μm, which is of the order of the thickness of the joining material at the interface.

In an exemplary method of joining parts, a joining material consisting of nanocrystalline magnetic metal-aluminum particles may be dispersed at an interface of two or more parts to be joined. In the presence of an applied AMF having a suitable magnetic field strength and frequency, the nanocrystalline metal-aluminum undergoes an exothermic phase transformation which melts the powder. A bond is formed between the two or more parts when the resulting metal aluminide resolidifies.

In another exemplary method of joining parts, nanocrystalline magnetic metal-aluminum particles may be dispersed at an interface between parts, or as an integral portion of one or more parts, having a melting point that is less than or equal to the exothermic transformation temperature of the nanocrystalline metal-aluminum powder. Upon application of an AMF, a portion of the part(s) in thermal contact with the metal-aluminum melts at or below the exothermic transformation temperature of the metal-aluminum and contributes to bonding of the parts. The part(s) may, for example, be fabricated from a polymer or mixture of polymers having a melting point of about 400° C. or less, for example.

In another exemplary method of joining parts, nanocrystalline magnetic metal-aluminum particles may be dispersed within a prefabricated article that is manufactured from a material having a melting point that is less than or equal to the exothermic transformation temperature of the nanocrystalline metal-aluminum powder. In one example, the prefabricated article may be sized and shaped in accordance with specific parts to be joined. For example, a prefabricated ring may be placed between two pipes to be joined. Upon application of an AMF, a portion of the material in thermal contact with the metal-aluminum melts at or below the exothermic transformation temperature of the metal-aluminum and contributes to bonding of the parts.

In another example, the prefabricated article containing the nanocrystalline metal-aluminum particles may be formed as a tape having an adhesive on one or both surfaces. The tape may be positioned between two or more parts to be joined and the adhesive may temporarily hold the tape in place. Application of an AMF having a suitable magnetic strength and frequency causes a portion of the tape material in thermal contact with the metal-aluminum to melt at or below the exothermic transformation temperature and contribute to formation of a permanent bond between the parts. Suitable tape and adhesive materials are known in the art.

In another exemplary method of joining parts, nanocrystalline magnetic metal-aluminum particles may be dispersed with a solder having a melting point that is less than or equal to the exothermic transformation temperature of the nanocrystalline metal-aluminum powder. If the melting point of the solder is less than the exothermic transformation temperature, application of an AMF causes the solder alone to melt and form a bond between the parts. On the other hand, if the melting point of the solder is equal to the exothermic transformation temperature of the metal-aluminum, application of an AMF causes the solder and metal-aluminum to melt concurrently and both contribute to bonding of the parts.

A solder or braze (a.k.a., hard solder) is a fusible metal alloy. Solder typically has a melting point or melting range between 90 to 450° C., and more typically between 180 and 190° C. Lead-free solders in commercial use may contain tin, copper, silver, bismuth, indium, zinc, antimony and traces of other metals. Hard solder, used for brazing, is generally a copper/zinc or copper/silver alloy that melts above 450° C.

In another exemplary method of joining parts, nanocrystalline magnetic metal-aluminum powder may be dispersed with a solvent and binder to form a slurry. The slurry may be "painted" or silk-screen printed onto a surface of a part, or the part may be dipped into the slurry. Depending on the solubility of the binder, the solvent, which may be present in any suitable amount such as up to about 5 wt %, may be aqueous or non-aqueous. The binder may, for example, be blended with the metal-aluminum powder in an amount such as up to about 5 wt. %. Solvents and binders within a slurry may evaporate or burn off (i.e., decompose) prior to or during heating, or the binder may remain unaffected by heating in the range of the exothermic transformation temperature.

In an embodiment, metal-aluminum powder may be applied to a surface of a part as a slurry. Solvent may evaporate before the part is contacted with a second part to which it will be joined. Application of an AMF melts the metal-aluminum powder, but leaves the binder unchanged. The metal aluminide solid formed by this method is free of bubbles, which might otherwise form during loss of solvent or gaseous decomposition products from a melt. Void spaces (bubbles) are known to weaken the structural integrity of solids, and are advantageously avoided.

Suitable binders that are soluble in non-aqueous solvent include cellulose, methyl cellulose, ethyl cellulose, carboxymethylcellulose, cellulose acetate-butyrate, nitrocellulose, paraffin, petroleum resins, polyethylene, polyacrylate esters, poly methyl-methacrylate, polyvinyl alcohol, polyvinyl butyral, polyvinyl chloride, vinyl chloride-acetate, polytetrafluoroethylene, poly-α-methyl styrene and combinations thereof.

Suitable non-aqueous solvents include but are not limited to acetone, methyl ethyl ketone, methyl isobutyl ketone, cyclohexanone, alcohols (e.g., methanol, ethanol, isopropanol, butanol), benzene, toluene, xylene, carbon tetrachloride, bromochloromethane, diacetone, trichloroethylene, tetrachloroethylene and combinations thereof.

Binders that are soluble in aqueous solvent (e.g., water) include but are not limited to acrylic polymer, acrylic polymer emulsion, ethylene oxide polymer, hydroxy ethyl cellulose, methyl cellulose, polyvinyl alcohol, tris isocyaminate, wax emulsions, acrylic copolymer latex, polyurethane, polyvinyl acetate dispersion and combinations thereof.

The following examples set forth methods for joining two or more parts by inducing magnetic hysteresis losses in nanocrystalline magnetic metal-aluminum powders. These examples teach by way of illustration, not by limitation, and should not be interpreted as unduly narrow.

EXAMPLE 1

Joining of Two or More Parts via Magnetic Heating of Metal-Aluminum Powders

Nanocrystalline magnetic metal-aluminum powders are used in the present method for joining two or more parts. The nanocrystalline metal-aluminum powders may be produced, for example, by the mechanical alloying/milling technique described by Zeng and Baker, or by other known techniques, such as inert gas condensation, severe plastic deformation, plasma processing and laser ablation. Those skilled in the art may select an appropriate process based on, for example, available resources, production scale and processing costs.

The nanocrystalline magnetic metal-aluminum powder is dispersed at an interface between two or more parts to be joined. The powder may be used alone, or applied in the form of a slurry, which contains a solvent and binder.

The powder is heated by applying an AMF. For example, an AMF of 210 Oe having a frequency of 250 KHz produces a heating rate of 15° C.·s$^{-1}$ for nanocrystalline Fe-40Al. The powder reaches 400° C. in about 25 s and undergoes an exothermic transformation that causes melting of the powder. Upon resolidification, the iron aluminide solid adopts a B2 structure, which is non-magnetic. Thus, a bond that is formed by this process will not remelt upon subsequent application of an AMF.

EXAMPLE 2

Joining of Parts having Low Melting Points

Joining of parts by magnetic heating of nanocrystalline magnetic metal-aluminum powders may be performed when one or more of the parts is manufactured from a material having a melting point less than or equal to the exothermic transformation temperature of the metal-aluminum. In such a case, a portion of the part(s) will melt, either before or with the metal-aluminum powder, and contribute to bonding.

The nanocrystalline metal-aluminum powder may be dispersed at the interface of two or more parts, at least one of which has a low melting point, and the method generally described in Example 1 may be used to heat the metal-aluminum powder. If the melting point of the part(s) is less than the exothermic transformation temperature of the metal-aluminum, a portion of the part(s) in thermal contact with the metal-aluminum melts and forms a bond at a temperature below the exothermic transformation temperature. The metal-aluminum powder retains its physical and magnetic characteristics, and is susceptible to heating by a subsequently applied AMF.

On the other hand, if the melting point of the part(s) is equal to the exothermic transformation temperature of the metal-aluminum, a portion of the part(s) in thermal contact with the metal-aluminum will melt concurrently with the metal-aluminum powder, and both the melted portion of the part and the metal aluminide will contribute to bonding.

In one embodiment, the nanocrystalline magnetic metal-aluminum powder may be integrated into the part(s). For example, a region of the part(s) at the interface that is approximately one centimeter or less in thickness may be impregnated with nanocrystalline magnetic metal-aluminum powder, which causes the region to melt in the presence of an applied AMF.

EXAMPLE 3

Metal-Aluminum Powder Dispersed with Solder/Braze

Joining of parts by magnetic heating of nanocrystalline magnetic metal-aluminum powders may be performed when solder is dispersed with magnetic metal-aluminum powder at the interface of two or more parts to be joined. The solder may have a melting point that is less than or equal to the exothermic transformation temperature of the nanocrystalline metal-aluminum.

If the melting point of the solder is less than the exothermic transformation temperature of the metal-aluminum, the solder that is in thermal contact with the metal-aluminum will melt and form a bond at a temperature below the exothermic transformation temperature. The metal-aluminum powder retains its physical and magnetic characteristics, and is susceptible to heating by a subsequently applied AMF.

On the other hand, if the melting point of the solder is equal to the exothermic transformation temperature of the metal-aluminum, the solder that is in thermal contact with the metal-aluminum will melt concurrently with the metal-aluminum powder, and both the solder and the metal aluminide will contribute to bonding.

It is understood for purposes of this disclosure, that various changes and modifications may be made to the disclosed embodiments that are well within the scope of the present compositions and methods. Numerous changes may be made which will readily suggest themselves to those skilled in the art and which are encompassed in the spirit of the compositions and methods disclosed herein and as defined in the appended claims.

All patents, patent applications and publications mentioned in this application are incorporated by reference in their entirety.

What is claimed is:

1. A method for joining at least two parts, said method comprising:
    dispersing a joining material comprising a nanocrystalline metal-aluminum powder at an interface between at least two parts to be joined; and
    applying an alternating magnetic field (AMF) having a magnetic field strength and frequency thereby inducing magnetic hysteresis losses in the metal-aluminum powder for a period that raises a temperature of the metal-aluminum powder to an exothermic transformation temperature where the metal-aluminum powder melts and resolidifies as a metal aluminide solid having a non-magnetic configuration.

2. The method of claim 1, the joining material further comprising a solder.

3. The method of claim 1, the joining material disposed within a polymer.

4. The method of claim 1, the joining material disposed within a slurry.

5. The method of claim 1, the AMF having a magnetic field strength in a range between 50 Oe and 2000 Oe.

6. The method of claim 1, the AMF having a frequency in a range between 25 KHz and 100 MHz.

7. The method of claim 1, wherein the period is in a range between 5 seconds and 100 seconds.

8. The method of claim 1, wherein the at least two parts are joined at a non-planar interface.

9. The method of claim 1, wherein the non-magnetic configuration of the metal aluminide is a B2 structure.

10. The method of claim 1, wherein the metal aluminide is according to a formula:

(x)M-(y)Al, wherein M is a metal or combination of metals selected from Fe, Ni and Co;
    x ranges from 55 to 80 atomic percent; and
    y ranges from 20 to 45 atomic percent.

11. The method of claim 10, wherein x is 60 atomic percent and y is 40 atomic percent.

12. The method of claim 1, wherein the metal aluminide is selected from the group consisting of iron aluminide, nickel aluminide, cobalt aluminide, ternary intermetallic compounds comprising Al and two metals selected from Fe, Ni and Co, quaternary intermetallic compounds comprising Fe, Ni, Co and Al, and physical mixtures thereof.

13. The method of claim 1, wherein the metal aluminide is iron aluminide.

14. The method of claim 13, wherein the iron aluminide comprises 60 atomic percent iron and 40 atomic percent aluminum.

15. The method of claim 1, wherein the at least two parts form a combination selected from polymer-polymer, semiconductor-semiconductor, ceramic-ceramic, polymer-metal, polymer-semiconductor, polymer-ceramic, metal-semiconductor, metal-ceramic and semiconductor-ceramic.

16. The method of claim 1, wherein the at least two parts form a combination selected from semiconductor-semiconductor, ceramic-ceramic, metal-semiconductor, metal-ceramic and semiconductor-ceramic.

17. The method of claim 1, wherein the at least two parts form a combination selected from ceramic-ceramic and metal-ceramic.

18. The method of claim 1, wherein particles of the nanocrystalline metal-aluminum powder have diameters of between 1 μm and 25 μm.

19. The method of claim 1, wherein particles of the nanocrystalline metal-aluminum powder have diameters between 5 μm and 10 μm.

20. The method of claim 1, wherein the step of dispersing comprises painting, silk screening or dipping.

* * * * *